United States Patent [19]

Gieger

[11] 4,436,178

[45] Mar. 13, 1984

[54] HOUSING LOUDSPEAKER

[76] Inventor: Hans-Joachim Gieger, Fischerbrücke 5, 3300 Braunschweig, DE, Fed. Rep. of Germany

[21] Appl. No.: 342,163

[22] Filed: Jan. 25, 1982

[30] Foreign Application Priority Data

Jan. 29, 1981 [DE] Fed. Rep. of Germany ....... 3102870

[51] Int. Cl.[3] ............................................... H05K 5/00

[52] U.S. Cl. ..................................... 181/151; 181/199

[58] Field of Search ............... 181/146, 148, 151, 155, 181/156, 171, 172, 199, DIG. 1

[56] References Cited

FOREIGN PATENT DOCUMENTS 2336416 7/1973 Fed. Rep. of Germany ...... 181/155

*Primary Examiner*—Benjamin R. Fuller

*Attorney, Agent, or Firm*—Michael J. Striker

[57] ABSTRACT

The invention relates to a housing loudspeaker which in addition to the loudspeaker opening has a further opening in its outer wall of the housing. Components are provided in the inner space between the loudspeaker and the opening which should eliminate the sound emitted into the inside by the loudspeaker. For a surprising effective elimination of the sound and a corresponding capacity increase of the loudspeaker a consistent filling of a cross sectional face in the box intermediary space is provided which is composed of two partial faces with mutual components of different functions. One of the partial faces is designed as a large face and consists of a flow tight finishing of an elastically vibrating braced mass, for which a plate combination is used in particular. The other partial face is designed of a smaller face and consists of a flow opening which, however, is closed with a layer of granulated or transversely directed thread like material.

25 Claims, 4 Drawing Figures

HOUSING LOUDSPEAKER

BACKGROUND OF THE INVENTION

The invention relates to a housing loudspeaker which in addition to a housing loudspeaker opening has a further opening in the outer wall of the box and is provided with components in the inner space of the box between the loudspeaker and the opening, which components eliminate the sound emitted by the loudspeaker into the inside of the box.

Such a housing loudspeaker uses as components vibrationable web of materials made from a thread lace work, which is suspended in a plurality of yieldable layers within of the box (DE-AS 22 18 496). This known loudspeaker is sufficiently effective in the lower frequency range, however it is important to eliminate a feedback on the loudspeaker, generated by the sound emitted into the interior of the box at the upper frequency range. Furthermore, it is important not to emit a sound from the opening of the box in the lower frequency range, because this would be counter productive to the front side emission of the loudspeaker.

SUMMARY OF THE INVENTION

It is an object of the invention to develop a loudspeaker of the aforementioned type wherein a feedback of the sound which travels into the inside of the box is substantially eliminated for the functioning of the loudspeaker, so as to obtain a true sound capacity and strong sound emission of the loudspeaker throughout the total frequency range.

This and other objects are obtained in accordance with the invention by a tight filling of a cross sectional face of the box intermediary space with two faces of two different functional components, namely, a large face flow tight closure made of an elastic vibrationable braced mass and, opposite small faced flow throughput openings, which are closed by a layer of granulated or transverse directed filament like fibers.

The sound emitted into the interior of the box by the loudspeaker is effective in two ways in these particular installations. Because the air is considered at the first moment as a pressure build up inside of the box, generated by the loudspeaker, and therefore is considered to be an incompressible medium, thus the large face closure, which consists of an elastic vibrating braced mass, is thereby elastically deformed.

Because the vibrationable braced mass is advantageously designed with more mass with respect to the vibration member of the loudspeaker which member is responsible for the sound generation, which is already obtained by the large face of this closure, the sound energy emitted to the interior of the box results in a corresponding small deformation of this vibrationable setting. A return effect on the loudspeaker is thereby eliminated. A part of the energy is absorbed by the vibrationable setting, in particular if one uses for this flow tight closure a plate combination made of an elastic deformable layer, like rubber or plastic and a plastic yielding layer, like a felt. A part of the energy is consumed in the plastic yielding layer. This plastic layer also determines the vibration characteristics of the elastically deformable layer connected therewith.

The pressure generated by the sound in the interior of the box results in a flow in the mentioned small faced flow throughputs of the inventive cross sectional face filling on the inner side of the box. However, this flow is substantially destroyed due to the mentioned particular layer on account of the eddy formation. This is the result of the flow around the granulated or cross-sectional threads of the material in the layer. This results in a substantial reduction of the interfering pressure characteristics on the inside of the box. This combination, consisting of the flow sealed closure of a vibrationable braced means, on the one hand, and the flow throughput openings with the resistant intensive layer of the mentioned material, on the other hand, provide, as shown in practice, surprising ideal characteristics of such a housing loudspeaker. Loudspeakers with predetermined energy emission are characterized in the inventive housing loudspeakers by a substantially improved dynamic and layer capacity adjustment than in those known devices.

For improving the efficiencies it is recommended to mount additional weights on the elastically braced masses, in particular when the mentioned plate combinations are used. Such weights are advantageously mounted on the outer side of the plastic yielding layer, for example, by bonding, so that they are also moved during the aforementioned elastic deformations, results which in an energy consumption. For influencing the vibration characteristics, these additional weights are provided with elastic members, like torsion springs. Such weights have been shown to be beneficial when consisting of metal disks or metal rings which are disposed in the center area of this closure.

The mentioned plate combination is also suitable in providing the mentioned particular flow through openings of the invention within the plates, whereby the mentioned particular material can be installed into a packing.

A substantial improvement of the structure is obtained when a plurality of the mentioned closures are provided inside of the box, which are mounted at a distance spaced apart from each other. In accordance with the efficiency, it has been shown to choose the layer arrangement in the indididividual layers mirror inverted with respect to each other, in the case of plate combinations.

Furthermeasures and advantages of the invention can be seen from the claims, the following description and the drawings, wherein the invention is shown in an exemplified embodiment.

DETAILED DESCRIPTION OF THE PREFERRED EMBODIMENTS

Figure 1:
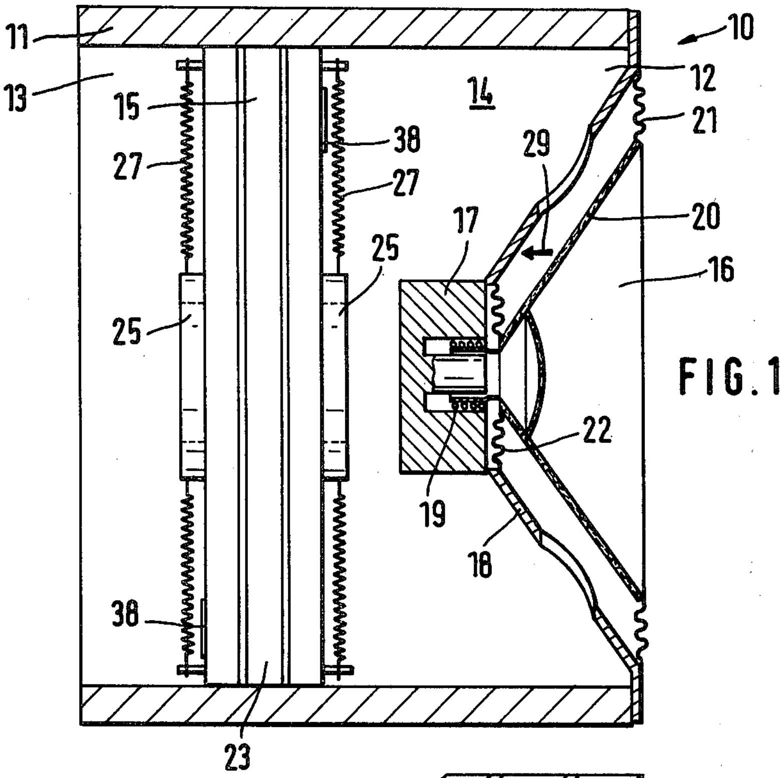
FIG. 1 is a schematic longitudinal section through a housing loudspeaker in accordance with the invention, illustrating the principle structure.

A housing loudspeaker 10 comprises a housing 11 which at the viewing side is provided with a loudspeaker opening 12 and at the rear with an opening 13 extending over the total housing face. Between these two openings 12,13 a structural unit 15 is provided inside of the housing, which unit fills one cross sectional face, without leaving any free space.

A loudspeaker 16 in opening 12 is merely shown schematically in a possible exemplified embodiment, such that it encompasses magnet 17 which is retained in a cone shaped basket 18, wherein a vibration coil 19 is disposed in the crest area of a cone membrane 20 which is suspended by means of bracing clamps 21 in the loudspeaker opening 12 and over a centering membrane 22 in the area of the cone tip. It is to be understood that a different structure of the loudspeaker 16 may be used.

Figure 2:
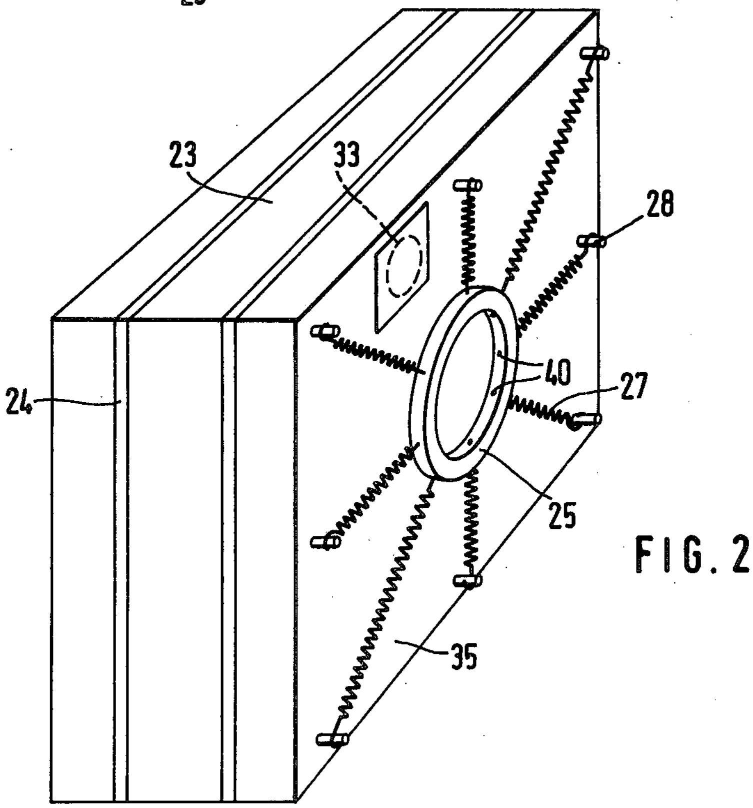
FIG. 2 is a perspective view showing an installation which in accordance with the invention is to be installed into the box which can be premade as a structural unit.
Figure 3:
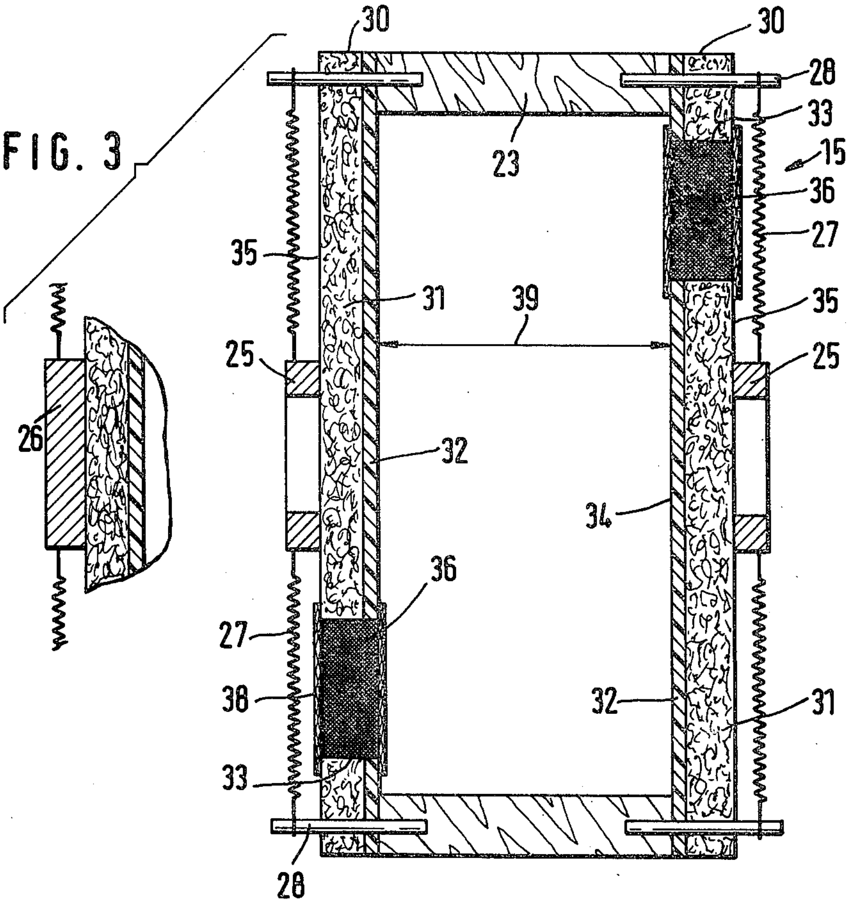
FIG. 3 is a longitudinal sectional view through the structure of FIG. 2 from which the structure can be seen schematically.

The structural unit 15 on the inside 14 of the box can be recognized from FIG. 2, and in particular from FIG. 3. By outer seals 24, the frame 23 can be fit flow tight in a cross sectional frame of the inner space of the box. The retention of the frame 23 on the inside of the box is not shown in detail. At the front side, as well as on the rear side, frame 23 is closed off by a plate combination 30 of two layers 31,32 which are not continuous, but have at least one penetration 33 which covers a small partial face of the cross sectional area of the box, seen in a plan view. The one layer 32 consists of elastically deformable material, namely rubber or plastic, while the other layer 31 is plastically yieldable and is made from felt, in this case. In the double plate combination 30,30 used here, the two layers are disposed in a mirror inverted manner with respect to each other, namely in such a manner that the elastic rubber layer 32 is disposed on the inside, while the plastic felt layer 31, is disposed on the outside.

For increasing the masses of these plate combinations 30, two additional weights are provided in the center area 34 which are shaped as metal rings 25 or metal disks 26, which are mounted on the outside 35 of each plate combination 30, namely on felt layer 31, preferably by bonding thereto.

These weights 25,26 are braced in front of the plate combination 30 by their own elastic members 27, namely torsion springs. The torsion springs 27 can be retained by means of retainers 28, for example, end sided retaining bolts and connected with frame 23.

Figure 4:
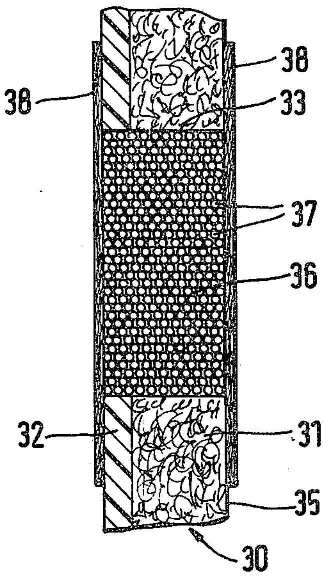
FIG. 4 is an enlarged, a detailed view of the structural unit of FIG. 2.

The mentioned penetrations 33 are filled out with a packing 36 of granulated material which is rounded, but in particular, is ball shaped. As can be seen from FIG. 4, balls 37 are shaped from a gas-chromatographic suitable material which has a rough surface, because this is particularly efficient for generating eddies during the flow of the air. In the present case, packing 36 is integrated as a structural unit into the plate combination 30, it completely fills the penetration 33 and can be best mounted therein so that the penetration 33 is covered at both faces by textile flat pieces 38, namely fabric or knitted fabric.

The packing 36 with its end closures 38 could also be shaped in form of a plug which during the assembly of the structural unit 15 is inserted in the penetration 33. Instead of bolts 37, one could use thread like elements which extend in a transverse direction with respect to the flow passage, because in this manner an energy reduction due to the generation of turbulence is obtained in an optimum manner. It is to be understood that also a plurality of such plate combinations 30 with penetrations 33 may be used in the structural unit 15.

The structural unit 15 permits a complete assembly of the inventive box installation. After the units are finished they may even be installed afterwards into already existing boxes. Therefore, the exchange and replacement of installations is readily available in accordance with the invention.

The elastically suspended masses which form the cross sectional closure therefore consist of the plate combination 30 with the two mentioned layers 31,32, but above all, of the weighty metal ring 25 or the metal disk 26. These masses are larger than the vibrationable masses of the loudspeaker 16, namely its cone membrane 20 which functions as a vibration part together with vibration coil 20 and with the associated suspension 21,22. If, during operation, this vibration member of the loudspeaker is moved inwardly in a vibration phase in the direction of the illustrated arrow 29 of FIG. 1, the pressure generated on the inside 14 of the box propagates to the outer face 35 of the plate combination 30 and deforms it inwardly, due to the elastic housing. Due to the mentioned large masses, only a relatively low vibration amplitude is obtained which can be additionally reduced in that the elastic deformation operation in the rubber layer 32 increases greatly with the increased amplitude curve. However, this elastic rubber layer 32 is connected over the total face with the plastic felt layer 31, so that in this deformation a strong damping on the deformation characteristics of the rubber layer is executed by the front side felt layer 31. The felt layer 31 also prevents a reflection of the sound. However, the latter is prevented because the mentioned penetrations 33 are freely exposed to the air flows, in which air flows by generating turbulence around the individual balls 37 of the packing 36 disposed therein. Thereby, the energy is substantially consumed. However, a residue flow travels between the distance spaces 39 of the structural unit 15 between the the two plate combinations 30, as can be seen in FIG. 3, so that the effective residue pressure can carry out a corresponding effect on the rear closure of the plate combination and its penetrations 33 with the associated packing 36. This is carried out in the same manner. Thereby, a return effect on loudspeaker 16 which interferes cannot be detected any longer. As can be seen from the structure of FIG. 3, the two penetrations 33 of the different closures are disposed in an offset manner with respect to each other, so that the vibration characteristics can form in each of these closures in the described manner, although with a decreasing effect towards each other when being compared with each other.

For the elastic characteristics, they are defined not only by the material characteristics of the mentioned rubber layer 32 with its damping effect by the plastic layer 31, but also by the parallely disposed torsion springs 27 of the weights 25,26. With a predetermined material of the plastic layer 32, the vibration characteristics may be defined by adjusting or exchanging the torsion springs 27. Thereby, an adjustment of the characteristics to the specific characteristics of each loudspeaker 16 is made easily possible. With a metal ring 25, the inner ends of the torsion springs 27 can be easily mounted on the inner space of the ring, as can be seen at 40 in FIG. 2.

It will be understood that each of the elements described above, or two or more together, may also find a useful application in other types of loudspeakers differing from the types described above.

While the invention has been illustrated and described as embodied in a housing loudspeaker, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A loudspeaker comprising a housing having an interior defined by an inner wall; a loudspeaker element in said interior and having a vibration member, said housing being formed with a loudspeaker opening in one face thereof and an additional opening at an opposite face thereof, said openings defining a box-like intermediate space in said interior; and means for eliminating the sound emitted by the loudspeaker into said interior, said means including a filling with two sound-absorbing faces mounted in said box-like intermediate space between said loudspeaker opening and said additional opening, one of said faces being defined by a flow-tight closure of an elastically vibrationable mass positioned within said interior and having a predetermined size, and the other of said faces being defined by at least one air-flow opening in said closure, said air-flow opening being filled with a packing and having a size much smaller than the size of the flow-tight closure.

2. The loudspeaker as defined in claim 1, wherein said packing is formed of granulated material.

3. The loudspeaker as defined in claim 1, wherein said packing is formed of filament-like material with a direction of filaments being transverse to said air-flow opening.

4. The loudspeaker as defined in claim 1, wherein said closure has a larger mass than that of the vibration member of the loudspeaker.

5. The loudspeaker as defined in claim 4, said flow-tight closure including at least one plate-like combined member, said combined member including an elastically deformable layer and a plastically yieldable layer adjacent said elastically deformable layer.

6. The loudspeaker as defined in claim 5, said elastically deformable layer being made of plastic.

7. The loudspeaker as defined in claim 5, said elastically deformable layer being made of rubber.

8. The loudspeaker as defined in claim 5, said plastically yieldable layer being made of felt.

9. The loudspeaker as defined in claim 5, wherein said plate-like combined member includes at least one weight mounted in a central area of said plate-like combined member.

10. The loudspeaker as defined in claim 9, wherein said weight is mounted on a side of the plastically yieldable layer opposite to said elastically deformable layer.

11. The loudspeaker as defined in claim 10, wherein said weight is connected to the plastically yieldable layer by bonding.

12. The loudspeaker as defined in claim 10, wherein said plate-like member includes at least one elastic element retaining said weight on said combined member.

13. The loudspeaker as defined in claim 12, said elastic element being a torsion spring.

14. The loudspeaker as defined in claim 13, wherein said elastically deformable layer is mounted to said plastically yieldable layer in a dotwise fashion.

15. The loudspeaker as defined in claim 13, wherein said weight is a metal disc.

16. The loudspeaker as defined in claim 13, wherein said weight is a metal ring.

17. The loudspeaker as defined in claim 1, wherein said air-flow opening is formed by a perforation in the plate-like combined member.

18. The loudspeaker as defined in claim 17, said plate-like combined member further including textile webs which cover said perforation at both ends thereof.

19. The loudspeaker as defined in claim 1, wherein said flow-tight closure includes a plurality of successive plate-like combined members spaced from each other in said intermediate space by a predetermined distance.

20. The loudspeaker as defined in claim 19, wherein said flow-tight closure includes two plate-like combined members mounted in said interior in a mirrow-inverted relation.

21. The loudspeaker as defined in claim 20, wherein said two plate-like combined members are connected to each other by a frame.

22. The loudspeaker as defined in claim 2, wherein said granulated material is rounded.

23. The loudspeaker as defined in claim 22, wherein said granulated material is ball-shaped.

24. The loudspeaker as defined in claim 23, wherein said granulated material is provided with a rough surface.

25. The loudspeaker as defined in claim 25, wherein said granulated material is formed of gas chromatographic compounds.

* * * * *